US008837763B1

(12) United States Patent
Millen et al.

(10) Patent No.: US 8,837,763 B1
(45) Date of Patent: Sep. 16, 2014

(54) INERTIALLY BALANCED MINIATURE LOW FREQUENCY SPEAKER SYSTEM

(75) Inventors: Samuel L. Millen, Somerville, MA (US); Lewis S. Athanas, West Newbury, MA (US)

(73) Assignee: Cue Acoustics, Inc., Somerville, MA (US)

( * ) Notice: Subject to any disclaimer, the term of this patent is extended or adjusted under 35 U.S.C. 154(b) by 9 days.

(21) Appl. No.: 13/534,980

(22) Filed: Jun. 27, 2012

Related U.S. Application Data

(63) Continuation of application No. 13/530,069, filed on Jun. 21, 2012, now abandoned.

(60) Provisional application No. 61/499,403, filed on Jun. 21, 2011.

(51) Int. Cl.
*H04R 1/02* (2006.01)
*H04R 25/00* (2006.01)
*H05K 5/00* (2006.01)

(52) U.S. Cl.
USPC ............ 381/345; 381/335; 381/186; 181/145

(58) Field of Classification Search
USPC ......... 381/186, 335, 336, 345, 351, 349, 333, 381/388, 306, 86; 181/144, 145, 148, 156
See application file for complete search history.

(56) References Cited

U.S. PATENT DOCUMENTS 7,953,239 B2 * 5/2011 Decanio ........................ 381/349
2010/0111343 A1 * 5/2010 Hsu ............................... 381/335
2012/0033826 A1 * 2/2012 Kakumoto ...................... 381/86

OTHER PUBLICATIONS

Klipsch Group Company, "Jamo SUB 800," 1 page, [online][retrieved on Nov. 13, 2013] Retrieved from the Internet <URL:http://www.voxxintlcorp.com/docs/common/SUB800/SUB800_CUT_SH.pdf>.

AE Spakers, "Passive Radiator Frequently Asked Questions," 4 Pages, [online] [Archived on web.archive.org on Mar. 18, 2009] [Retrieved on Jan. 10, 2014] Retrieved from the internet <URL:https://web.archive.org/web/20090318180410/http:/aespeakers.com/PRFAQ.php>.

* cited by examiner

*Primary Examiner* — Curtis Kuntz
*Assistant Examiner* — Sunita Joshi
(74) *Attorney, Agent, or Firm* — Fenwick & West LLP

(57) ABSTRACT

An inertially balanced miniature passive radiator full-range loudspeaker system is disclosed. In one embodiment the speaker system is a two-way system with low and high frequency components, where the low-frequency component is comprised of one active transducer and two passive radiators and the frequency range for this component is not outside of 10 Hz to 500 Hz. The low and high frequency components are individually optimized for operation in low and high frequency ranges respectively. By placing the passive radiators on opposing sides of an enclosure of the speaker system, the momentum generated by the motion of each of the passive radiators substantially cancels when the passive radiators are in phase. A passive radiators may be fitted with a voice-coil electrically connected to a corresponding voice-coil on the other passive radiator in a pair such that the generated back EMF resists out of phase motion of the passive radiators.

5 Claims, 9 Drawing Sheets

INERTIALLY BALANCED MINIATURE LOW FREQUENCY SPEAKER SYSTEM

CROSS REFERENCE TO RELATED APPLICATIONS

This application is a continuation of U.S. patent application Ser. No. 13/530,069 filed on Jun. 21, 2012, entitled "Inertially Balanced Miniature Low Frequency Speaker System" which claims the benefit under 35 U.S.C §119(e) of provisional application Ser. No. 61/499,403 filed on Jun. 21, 2011.

FIELD OF THE INVENTION

The present invention relates to loudspeaker systems, and more particularly, to low frequency passive radiator systems.

BACKGROUND

The miniaturization of loudspeakers has been a trend since the early days of domestic high-fidelity music systems. Space constraints and aesthetics are the driving forces for speaker miniaturization, and have been assisted by developments in transducer design and digital electronics. Presently, loudspeaker systems can be miniaturized to the point where the limiting factor is the physical realization of the enclosure, including the enclosure's size.

In the art of loudspeaker systems it is desirable to obtain an extended low frequency response. In addition, it is generally desirable to minimize the size of the loudspeaker enclosure, for example to reduce cost and allow for more flexible placement. These two goals are often in opposition, and it is well known that obtaining extended low frequency response typically requires large, floor standing speakers with significant internal volumes, and/or large diameter woofers. Both options require tradeoffs in terms of efficiency, cost and flexibility of use, with large speakers typically being less efficient, costing more, and being less flexible in terms of placement in a listener's home.

Among low frequency loudspeaker systems, the class known as "reflex systems" has approximately a 6 decibel (dB) advantage in efficiency/bandwidth over a simple sealed box loudspeaker. Accordingly, these reflex systems are commonly the system of choice where an extended low frequency response in a small device is desired. A reflex system loudspeaker can be implemented by constructing a duct, for example, a tube, connecting the interior of the loudspeaker enclosure to the outside environment. In operation of the loudspeaker, the air inside the duct becomes an acoustic mass, and the air within the enclosure is an acoustic compliance or spring. The acoustic mass and spring together create a second order filter system, which when combined with the natural second order response of the loudspeaker transducer, creates a fourth order high pass filter. This fourth order filter may exhibit approximately a 24 dB/octave attenuation of the low frequencies, for example. This system becomes increasingly difficult to realize with high performance miniature low frequency transducers because the necessary duct dimensions and volume approach or surpass those of the enclosure itself. Additionally, long duct tubes produce distortions of the acoustic output, for example, pipe resonances and other noise, which may render the system unusable, particularly in high performance applications.

An alternative implementation of a reflex system replaces the duct with a passive radiator. A passive radiator is essentially a loudspeaker without a magnet or voice coil. A passive radiator system may replicate the intended response of a vented system without the physical size and volume of the duct, producing a further miniaturized loudspeaker system. This may be accomplished by attaching a substantial weight to the passive radiator, which resonates with the compliance of the enclosed air in the loudspeaker enclosure. This weight can be approximately 10-50 times that of the moving mass of the active transducer. Modern loudspeaker systems may be constructed using lightweight, rigid space frames and miniature Neodymium magnet structures in low frequency transducers. In such systems, the passive radiator mass in vibratory motion can physically knock the loudspeaker onto its side, or cause it to move across surfaces and potentially fall. Accordingly, the stability, and hence the usefulness, of such systems is limited. In order to tune the passive radiator(s) in a small enclosure to a very low frequency, a great deal of mass must be added to the passive radiator(s), and the more mass added, the lower the resonant frequency of the radiator. There is also another dimension to the passive radiator(s) known as the compliance. Typically, the suspension of the radiator/driver acts as a mechanical spring that has damping properties and contributes to losses in the system. Increasing the mass of the radiators can negatively impact low frequency performance, particularly if the radiators are downward facing, since the high mass causes the suspension of the passive radiators to sag.

Assume for example, a rectilinear loudspeaker enclosure housing a woofer, on any of the six surfaces, and a single passive radiator on one vertical face. The stability of the system will be affected by the movement and location of the passive radiator, and the weight distribution of the system as a whole. There are two break points in system stability. First, when the force generated by the movement of the passive radiator shifts the center of gravity of the system such that the measured weight on one extreme side of the base of the loudspeaker system is countered or exceeded by this force, the enclosure will begin to rock back and forth. Second, if the force created by the mass times the acceleration of the passive radiator's movement exceeds the measured mass of the loudspeaker system at one extreme of the base of the loudspeaker system, and continues for a period of time of sufficient duration to move the center of gravity outside of the base of the loudspeaker system, the vertical integrity of the loudspeaker system will be compromised, and the loudspeaker may fall over. For example, the force created by 200 Hz raised cosine waveform is approximately ten times greater than at 20 Hz, and while lasting only one-tenth as long can be sufficient to easily destabilize a loudspeaker system. These stability concerns are scalable, and apply to any size loudspeaker system.

SUMMARY

The above and other problems are addressed by an inertially balanced implementation of a miniature passive radiator full-range loudspeaker system. In one embodiment the speaker system is minimally a two-way system with low and high frequency components, where the low-frequency component is comprised of one active transducer and two passive radiators and the frequency range for this component is not outside of 10 Hz to 500 Hz. The rational here is that the "best implementation" of the design is to have a dedicated low-frequency component such that high frequencies are not modulated by the low frequency driver. Thus, the loudspeaker system can accurately reproduce the full audible frequency spectrum with both the low and high frequency components being optimized for the corresponding portions of the audible frequency spectrum. As the full-range loudspeaker system only requires a single active transducer, the cost is reduced and the convenience is increased. For example, the loudspeaker system may be easily integrated into a flat screen television.

BRIEF DESCRIPTION OF DRAWINGS

Figure

DETAILED DESCRIPTION

Figure 1:
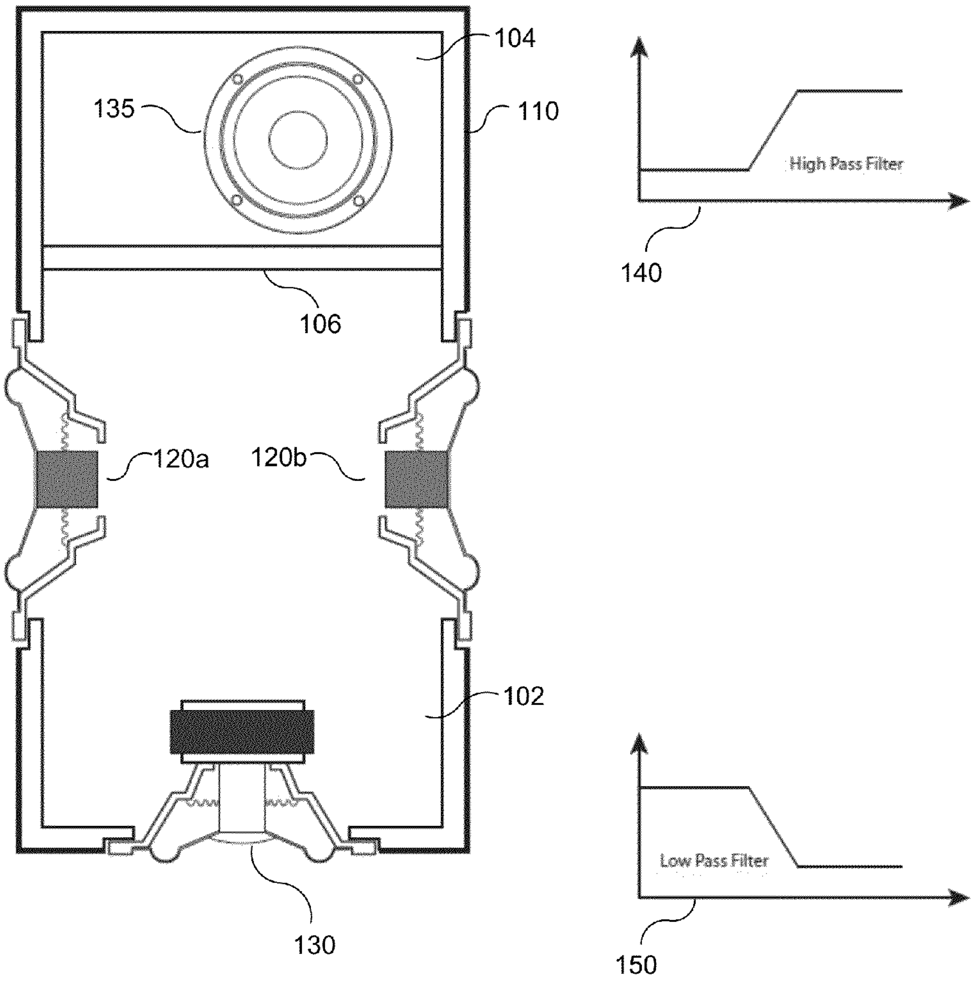
(FIG. 1 shows an inertially balanced loudspeaker system with a pair of passive radiators, in accordance with one embodiment.

Aspects and embodiments are directed to an inertially stable implementation of a miniature passive radiator loudspeaker system. The loudspeaker system uses passive radiators that are tuned to a very low frequency through added mass, while at the same time maximizing the efficiency and output by minimizing the losses due to low compliance and/or high damping. The result is a passive radiator that is ideally positioned on a vertical surface because if the passive radiator were placed on a horizontal surface (facing up or down) it would sag because of the high compliance suspension and the relatively high mass of the cone and added weight. Placing the radiators on opposed vertical surfaces results in an inertially stable configuration.

In one embodiment, a speaker system is minimally a two-way system where the low-frequency component is comprised of one active transducer and two passive radiators and the frequency range for this component is not outside of 10 Hz to 500 Hz. This frequency range for the low-frequency component is preferred so that high frequencies are not modulated by the low frequency driver. According to one embodiment, a miniature low frequency loudspeaker system is constructed with all moving passive masses within their respective frequency ranges and responses divided between two or a multiple of two equal but physically opposed devices (i.e., located on opposite sides of an enclosure), such that the net momentum of the moving passive masses is canceled out, creating a stable system free from extraneous vibration, physical rocking, or falling over on its side. In one embodiment, the enclosure has a small footprint, such as a box smaller than 15.5"×10"×7.5". In certain examples the loudspeakers are wireless speakers that may be wirelessly connected to other audio and/or audiovisual components.

According to certain embodiments, in a loudspeaker system with low frequency extension, small size, and high output, a passive radiator system including two passive radiators is configured as follows. First, the low frequency active speaker has sufficient surface area and excursion to move the required amount of air to affect the sound pressure level desired at the lowest frequency of interest, for example, to produce output in excess of 80 decibels at 50 Hz, measured at a distance of 1 meter. Second, the passive radiators are chosen to have a total surface area and excursion sufficient to move the required amount of air to affect the sound pressure level desired at the tuning frequency of the system. A factor of twice that of the active driver is recommended for typical QB3-QB4 alignments. This may be barely adequate for more extreme alignments requiring an extended bass response. In some embodiments, the surface area of the passive radiator may approach or even exceed three times the surface area of the active driver. In one embodiment, the total surface area of the passive radiators is 2.8 times the area of the active transducer.

For a given box volume and passive radiator surface area, the moving mass of the passive radiator is inversely proportional to the square of the tuning frequency of the system. For a given tuning frequency and passive radiator surface area, the moving mass of the passive radiator is inversely proportional to the square of the box volume. From these relationships it can be inferred that the moving mass of the passive radiator may be reduced greatly by the use a very small surface area with a long excursion suspension. However, it has been found that such conventional long excursion suspensions as may be used on sub-woofer drivers have substantially greater mechanical resistances such that the resonant effect needed to produce low frequency extension is effectively damped out, and the benefits of the reflex design are progressively negated. In consideration of these problems, in the various embodiments the compliance and damping of the passive radiator is lowered as much as possible by expressly using soft suspension parts (softer than typically used).

Furthermore, the moving mass of the active driver, though generally substantially less than that of the passive radiator, may be driven at sufficiently high accelerations that similar destabilizing effects to those attributed to the passive radiators as discussed above may be caused by the active driver. To overcome this problem, it is preferable to orient the active driver in the axis of gravity (facing up or down) in order to minimize it's affects of movement on the system. Because the active driver is producing mostly low frequency components of the sound, this is not substantially detrimental to the output sound quality.

One aspect is directed to a method of balancing the passive and active masses of a loudspeaker system such that all forces are negated, the system's non-output vibration is greatly reduced, and inertial stability is achieved in a manner that uniquely allows the use of a miniature passive radiator system. Generally, this stability is achieved using a minimum number of active transducers and radiators, thereby reducing overall system component costs and complexity. For example, in one embodiment, there is a single active transducer oriented on a horizontal surface of a rectilinear, (e.g., rectangular) enclosure, and two passive radiators oriented on opposite vertical surfaces thereof. As a result, substantially all of the forces produced by the oscillating passive system are balanced and cancel out, leaving an inertially balanced loudspeaker system.

An example of such a system is illustrated in FIG. 1. In the example illustrated in FIG. 1, the loudspeaker system includes an enclosure 110 and two passive radiators 120*a*, 120*b* located on opposite parallel sides of the enclosure. The loudspeaker system also includes an active transducer 130 located on another surface of the enclosure 110 and a high frequency speaker 135. A divider 106 separates the internal volume of the enclosure 110 to define a high frequency acoustic volume 104 and a low frequency acoustic volume 102. The high frequency speaker 135 is situated such it is acoustically coupled to the high frequency acoustic volume 104. The low frequency active driver 130 and the pair of passive radiators 120 are situated such that they are acoustically coupled to the low frequency acoustic volume 102.

In one embodiment, the signal received by the loudspeaker system is split by a crossover into two portions. The crossover may be passive (e.g., a passive crossover network) or active (e.g., a digital signal processor). The first portion, used to drive the active transducer 130, is passed through a low pass filter of the crossover, such as that demonstrated by graph 150. The second portion, used to drive the high frequency speaker 135, is passed through a high pass filter of the crossover, such as that demonstrated by graph 140. A crossover frequency in the range 100 Hz to 500 Hz is typically used. Thus, the high frequency speaker 135 can be optimized to accurately reproduce frequencies above the crossover frequency without modulation caused by the low frequency active transducer 130. The combination of the active transducer 130 and the passive radiators 120*a* and 120*b* can be optimized to actively reproduce frequencies below the crossover frequency. Alternatively, the enclosure 110 may be tuned using techniques known in the art such that, when provided with a full-frequency-range source signal, the sound output of the high frequency speaker 135 resembles graph 140 and the combined sound output of the active driver 130 and passive radiator pair 120 resembles graph 150.

As discussed above, the pair of passive radiators 120*a*, 120*b* are designed to have balanced or matching moving masses, such that in operation of the loudspeaker system the momentum of the passive radiators balances out, resulting in an inertially balanced system.

Still referring to FIG. 1, in the illustrated example, the active transducer 130 is located on the bottom surface of the enclosure 110. In one example, a single active transducer 130 is located on either the top or bottom of the rectangular enclosure 110, such that its motion is gravitationally opposed by the mass of the entire loudspeaker system. This may provide an essentially inertially balanced system, wherein there is no net side-to-side vector of inertial movement, the presence of which creates the most detrimental instability in a low frequency loudspeaker system. However, the active transducer 130 may be located on any surface of the enclosure 110, including those surfaces on which one or more passive radiators are located. In addition, certain examples may include two or more active transducers 130, as discussed below. If there are two or more active low frequency transducers 130, it is preferable for each one to be used in concert with only one acoustic volume and one pair of passive radiators.

Although only a single pair of passive radiators 120*a*, 120*b* is illustrated in FIG. 1, embodiments of the loudspeaker system may include any number of pairs of passive radiators. In order to maximize the low frequency output and efficiency of the system, it is preferable for each pair of passive radiators to be used in concert with only one acoustic volume and one active transducer 130. In one embodiment, illustrated in FIG. 2, a passive radiator loudspeaker system includes at least two, or a multiple of two, active transducers 130*a*, 130*b* located on opposing parallel surfaces of a rectangular enclosure 210, such that the forces created in relation to the enclosure are opposed, and cancel out, leaving an inertially balanced system. The loudspeaker system also includes a high frequency speaker 135. A pair of dividers 206*a*, 206*b* split the internal volume of the enclosure 210 into a high frequency acoustic volume 204 and a pair of low frequency acoustic volumes 202*a*, 202*b* (one for each low frequency active driver 130). As with the embodiment illustrated in FIG. 1, a crossover (and/or tuning of the enclosure 210) is used such that the frequency response of the high frequency speaker 135 resembles graph 140 and the frequency response of each combination of an active transducer 135 and pair of low frequency active transducers 130 resembles graph 150.

Figure 2:
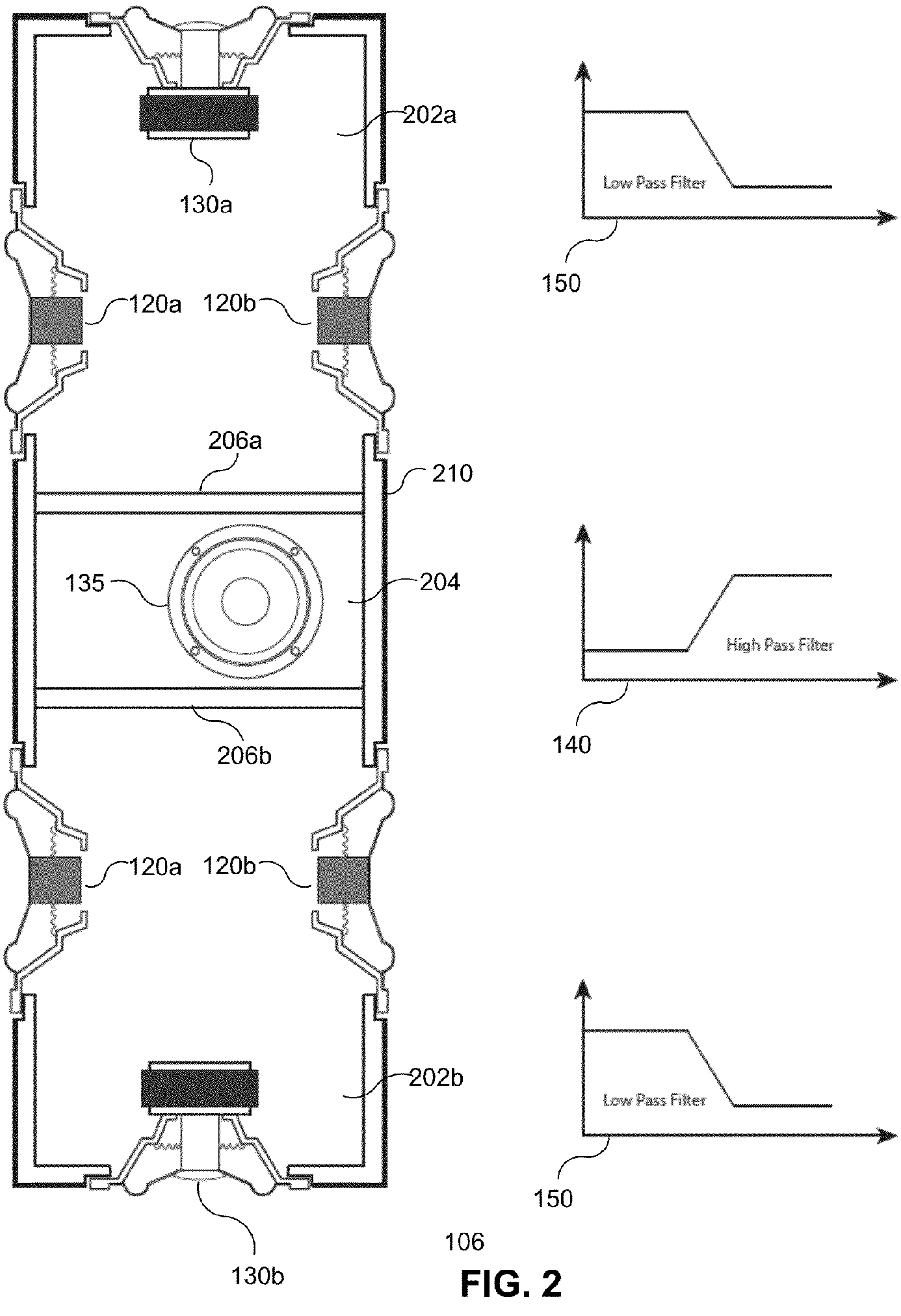
FIG. 2 shows an inertially balanced loudspeaker system with two pairs of passive radiators, in accordance with one embodiment.

In the example illustrated in FIG. 2, the pair of active transducers 130*a*, 130*b* are located on the top and bottom surfaces of the enclosure 210. However, the pair of active transducers 130 may be located on any opposite sides of the rectilinear enclosure, including those surfaces on which one or more passive radiators 120 are located. Similar to the pair(s) of passive radiators, the pair of active low frequency transducers 130*a*, 130*b* are designed to have balanced or matching moving masses, such that in operation of the loudspeaker system their momentum balances out, resulting in an inertially balanced system. As also discussed above, although only a single pair of active transducers 130*a*, 130*b* is illustrated in FIG. 2, embodiments of the loudspeaker system may include any number of pairs of active transducers 130.

In some examples, the loudspeaker system may be configured, for example, by appropriately selecting the weights and/or arrangements of the passive radiator and/or active transducer pair(s) such that the level of the pre-balanced inertial energy equals or surpasses the total physical weight of the loudspeaker system, or equals or surpasses the force needed to physically destabilize a loudspeaker system, such as in a tall configuration where the height of the speaker system is greater than its width.

Figure 3:
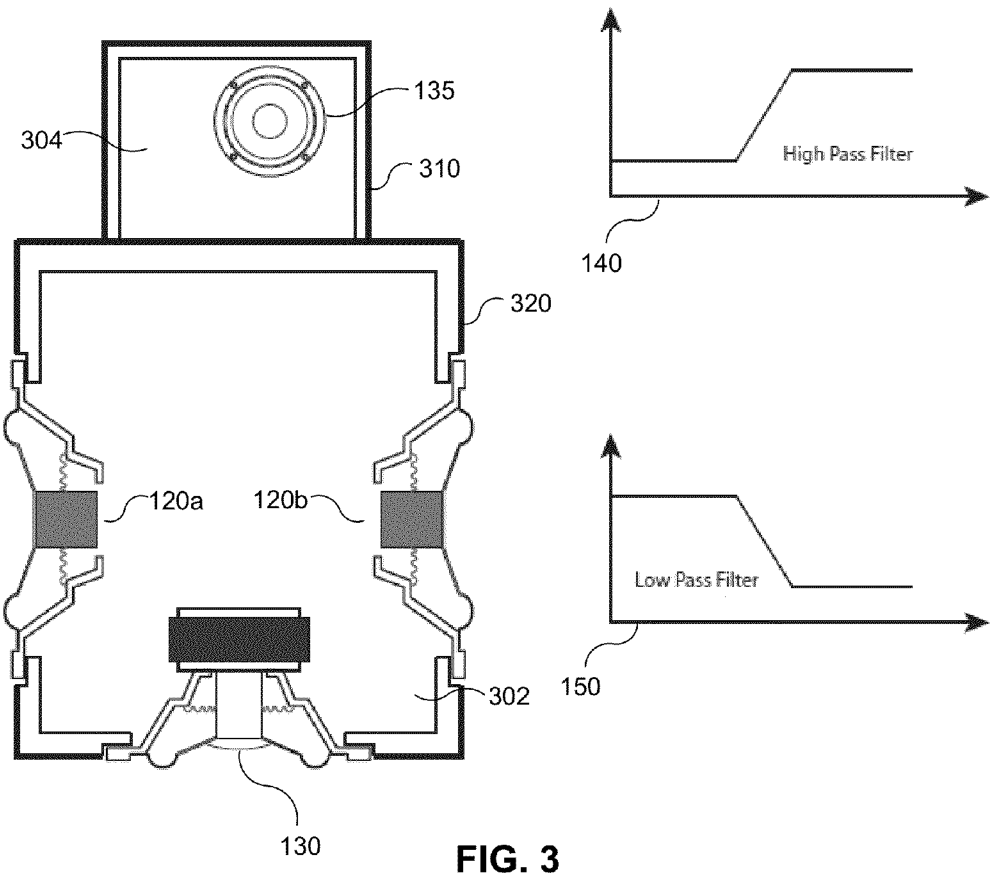
FIG. 3 shows an alternate configuration for an inertially balanced loudspeaker system with a pair of passive radiators, in accordance with one embodiment.

FIG. 3 shows an alternate configuration for an inertially balanced loudspeaker system with a pair of passive radiators, in accordance with one embodiment. In contrast to the embodiments shown in FIGS. 1 and 2, wherein the loudspeaker system is made up of a single cuboidal enclosure, the embodiment illustrated in FIG. 3 includes a high frequency enclosure 210 and a low frequency enclosure 320. The high frequency enclosure 310 includes a high frequency acoustic volume 304 and houses a high frequency speaker 135. The low frequency enclosure 220 includes a low frequency acoustic volume 302 and houses a low frequency active transducer 130 as well as a pair of passive radiators 120. As shown, the enclosures 310, 320 are cuboidal. However, in other embodiments, one or both are constructed with different geometries that allow the pair of passive radiators to be inertially balanced. For example, the low frequency enclosure 320 may be spherical with the passive radiators 120 situated at exactly opposite points. Further, while the high and low frequency enclosures 210, 220 are shown to be attached, the enclosures may be spatially separated, such as in the embodiment shown in FIG. 4.

Figure 4:
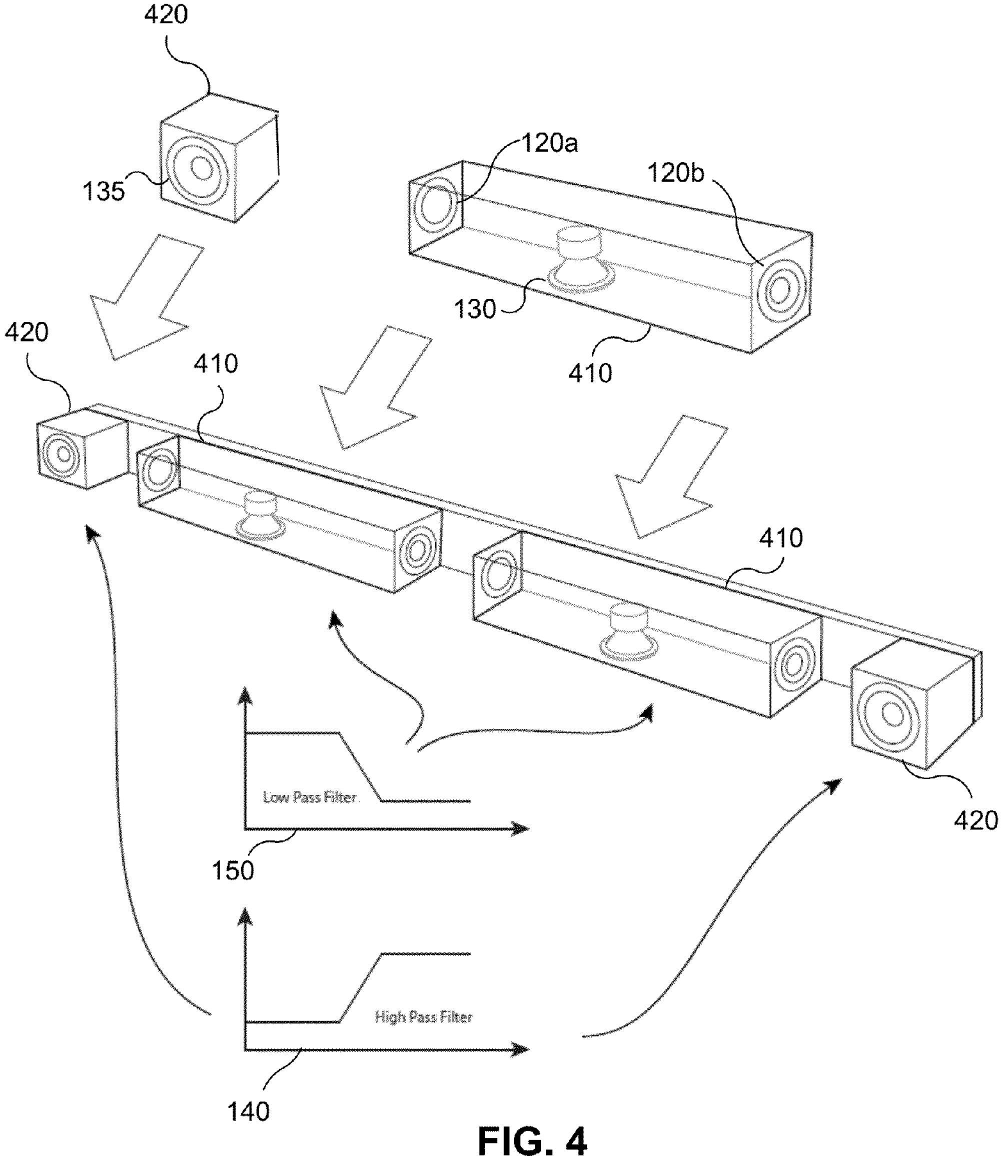
FIG. 4 shows an alternate configuration for an inertially balanced loudspeaker system with two pairs of passive radiators in physically distinct enclosures, in accordance with one embodiment.

FIG. 4 shows such an inertially balanced loudspeaker system with two high frequency speakers 135 and two pairs of passive radiators 120 in physically distinct enclosures. The loudspeaker system includes both high and low frequency enclosures 420, 410. The low frequency enclosures 410 include a low frequency active driver 130 and a pair of inertially balanced passive radiators 120. It is preferable for the active driver 130 to be aligned in the axis of gravity of the enclosure 410. For example, as shown, the active driver 130 is pointing downwards. The high frequency enclosures 420 include a high frequency speaker 135. Typically, a crossover is used such that the signal sent to the low frequency enclosures 410 passes through a low pass filter 150 and the signal sent to high frequency enclosures passes through a high pass filter 140.

The loudspeaker system shown in FIG. 4 is made up of two high frequency enclosures 420 and two low frequency enclosures 410. Thus, the loudspeaker system can reproduce stereo sound recordings. Note that the enclosures are configured such that the high frequency speakers 135 have the maximum possible separation in order to increase the stereo spread of the sound output, due to the greater directionality of the output of the high frequency speakers. In other embodiments, a single low frequency enclosure 410 is used, or two such enclosures are sent a merged-mono signal generated from a stereo signal. This may reduce the number of components, and therefore total cost, with minimal loss in output quality due to the lesser directionality of the output from the low frequency enclosures 410.

Figure 5:
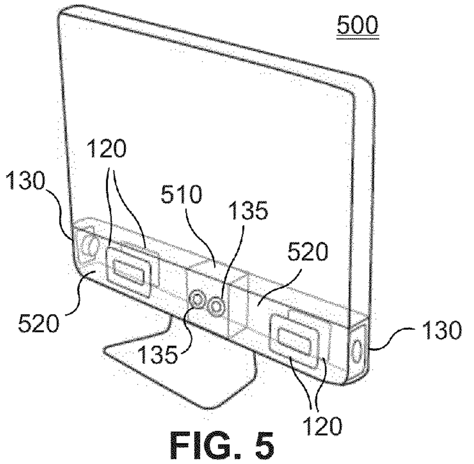
FIG. 5 shows an inertially balanced loudspeaker system integrated into a computer, television, or monitor, in accordance with one embodiment.

FIG. 5 shows an inertially balanced loudspeaker system integrated into a computer monitor 500 (or television, laptop, etc.) in accordance with one embodiment. The computer monitor contains two low frequency enclosures 520 and a single high frequency enclosure 510. As shown, the high frequency enclosure 510 is situated in the center of the front side of the computer monitor 500 and houses two high frequency speakers 135. However, other numbers of high frequency speakers 135 can be used. Each low frequency enclosure 520 includes a low frequency active transducer 130 and an inertially balanced pair of passive radiators 120. The low frequency enclosures 520 are configured such that the low frequency active transducers 130 are situated on opposite ends of the computer monitor 500. Each pair of passive radiators 120 is configured with one radiator in the pair on the front of the computer monitor 500 and the other radiator in the pair on the back of the monitor. Thus, the momentum generated by the active transducers 130 and the passive radiators 110 is substantially balanced.

Figure 6:
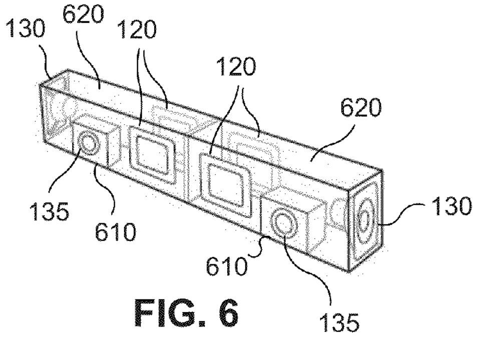
FIG. 6 shows an inertially balanced loudspeaker system for integration into a computer, television, or monitor, in accordance with one embodiment.

FIG. 6 shows an alternative configuration for the components of a loudspeaker system integrated into a computer monitor 500, television, laptop, or the like. Rather than having a single central high frequency enclosure, a high frequency enclosure 610 is set within each low frequency enclosure 620. This provides greater separation between the high frequency speakers 135 enabling stereo sounds to be reproduced. As with FIG. 5, the low frequency active transducers are situated on opposite ends of the computer monitor. When reproducing stereo sounds, the output of each low frequency active transducer 130 may be different, thus, the momentum of each will not be exactly balanced. However, such momentum will still partially cancel, thereby increasing the stability of the system. This is particularly true when the loudspeaker system is reproducing music, as the low frequency components of recorded music are often substantially similar between the left and right stereo channels. In one embodiment, a merged-mono signal is used to drive the low frequency active drivers 130 to provide more precise momentum balancing, with the separate stereo components being only provided to the high frequency speakers 135. However, as previously described, the mass of the low frequency active transducers 130 is typically much smaller than the mass of the passive radiators 120. Thus, when the loudspeaker system is integrated with a computer monitor 500 or the like (which has significant mass in its own right) inertial balancing of the relatively light active transducers 130 is of reduced importance.

Figure 7A:
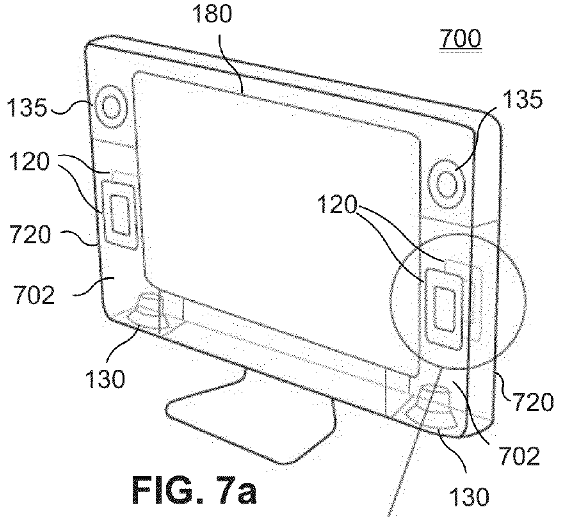
FIG. 7*a* shows an alternate configuration for an inertially balanced loudspeaker system integrated into a computer, television, or monitor, in accordance with one embodiment.
Figure 7B:
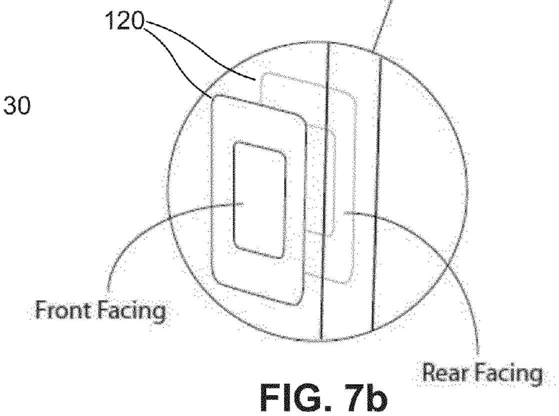
FIG. 7*b* is an expanded view of a pair of passive radiators from FIG. 7*a* illustrating that the pair are situated on opposing sides of the computer, television, or monitor.

FIG. 7*a* shows an alternate configuration for an inertially balanced loudspeaker system integrated into a computer monitor 700 or the like. In this configuration, left and right high frequency speakers 135 are situated on the front face of the computer monitor 700 to either side of the screen 180. Thus, the high frequency speakers 135 are separated by the maximum distance possible and provide the best possible stereo spread given the limited size of the monitor 700. The computer monitor 700 also has left and right low frequency enclosures 720 situated either side of the screen 180. Each low frequency enclosure includes a low frequency acoustic volume 702 and houses a low frequency active transducer 130 as well as an inertially balanced pair of passive radiators 120. The pairs of passive radiators 120 are situated with one pointing forwards and one pointing backwards, as shown in FIG. 7*b*. In this configuration, the low frequency active transducers 130 point downwards, thus, the weight of the monitor 700 acts to counterbalance any momentum generated and stabilizes the system. Thus, stereo signals can be provided to the pair of low frequency enclosures without destabilizing the computer monitor 700.

Figure 8:
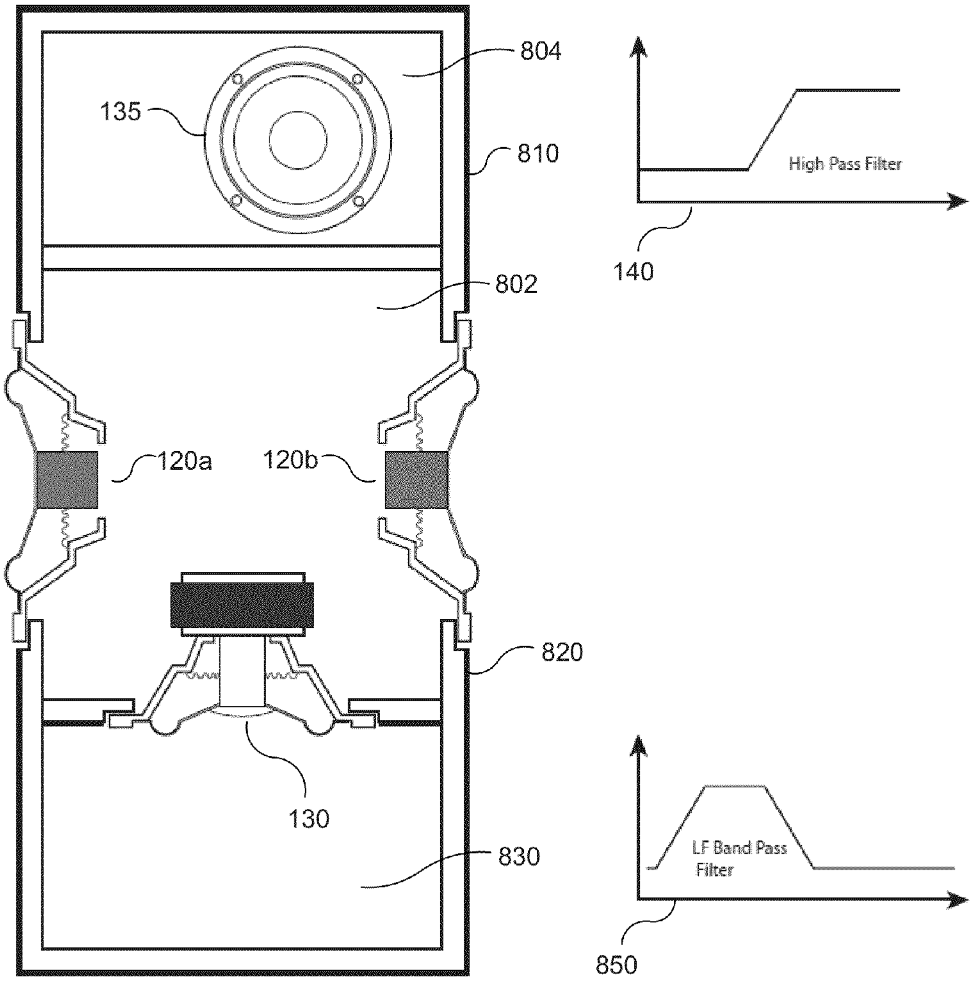
FIG. 8 shows an alternate configuration for an inertially balanced loudspeaker system in which the low frequency enclosure is tuned to have a frequency response equivalent to a low frequency band pass filter, in accordance with one embodiment.

FIG. 8 shows an alternate configuration for an inertially balanced loudspeaker system with a pair of passive radiators 120 in which the low frequency enclosure 820 is tuned to provide a frequency response equivalent to a low frequency band pass filter, in accordance with one embodiment. As with the embodiments described above, the high frequency speaker 135 is situated on the front face of a high frequency enclosure 810. The passive radiators 120*a*, 120*b* are situated on opposing vertical sides of the low frequency enclosure 820, and thus are inertially balanced. In this configuration, the low frequency active transducer 130 is situated inside the low frequency enclosure 820 pointing downwards into an air cavity 830. As described above, the output power of the combination of the low frequency active driver 130 and the passive radiators 120 drops off rapidly below the tuning frequency. As is known in the art, the output power of frequencies above a threshold frequency drop off rapidly when the driver in directed into an enclosed air cavity 830. Thus, the combination of these two effects yields a frequency response that looks similar to graph 850, i.e., a low frequency band pass filter.

Figure 9:
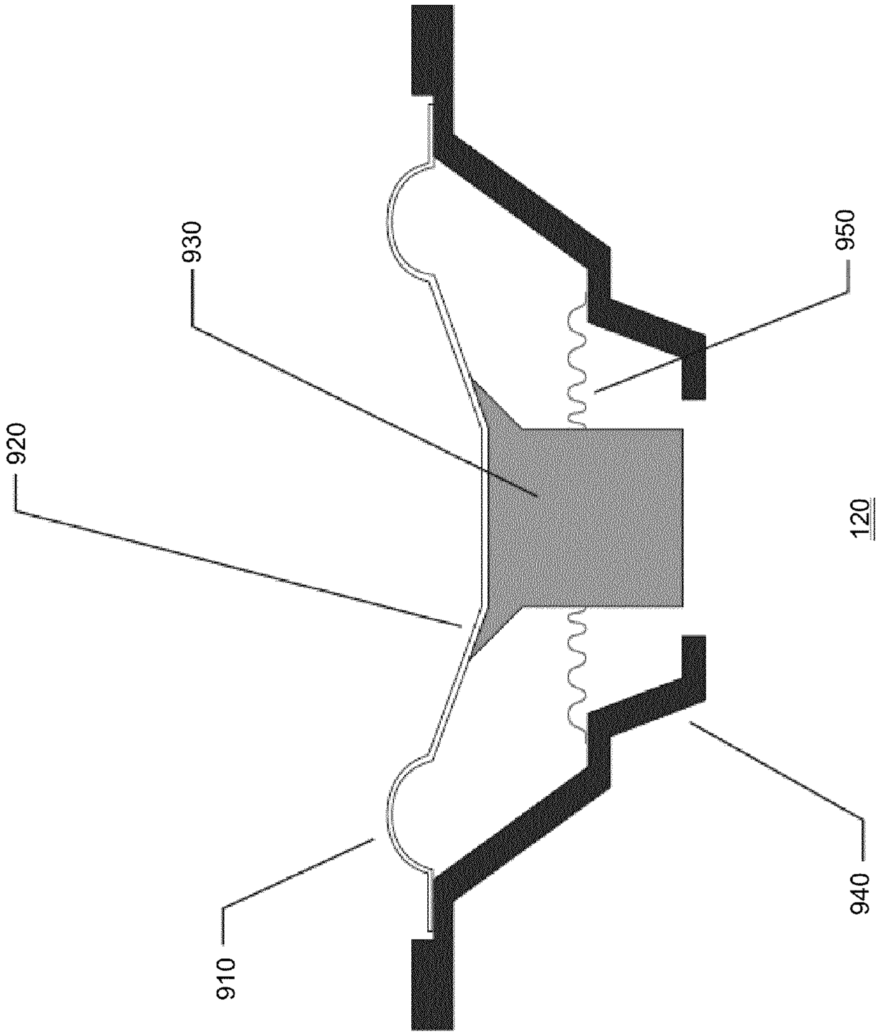
FIG. 9 shows a detailed cross section of a passive radiator, in accordance with one embodiment.

FIG. 9 shows a detailed cross section of a passive radiator 120, in accordance with one embodiment. The passive radiator 120 is housed in a cast or molded basket 940. The speaker cone 920 is made of a stiff material and is attached to a tuning mass 930 in order to tune the loudspeaker system by reducing the resonant frequency of the passive radiator 120. High density materials such as aluminum or steel are preferably used, but any material can be used. The speaker cone 920 is attached to the basket 940 with a high compliance rubber surround 910. Thus, losses due to the energy required in moving the speaker cone 920 and tuning mass 930, as opposed to air, are minimized. A high compliance spider 950 attaches the tuning mass 930 to the basket 940. The spider 950 acts to mechanically restrict movement of the speaker cone 920 and tuning mass 930 to the intended axis, thereby increasing the efficiency and output of the system. By increasing or decreasing the tuning mass 930, the tuning frequency of the loudspeaker system can be adjusted. In some embodiments, a method for altering the tuning mass 930 is provided, e.g., threaded holes for screwing in additional mass in known denominations.

Figure 10:
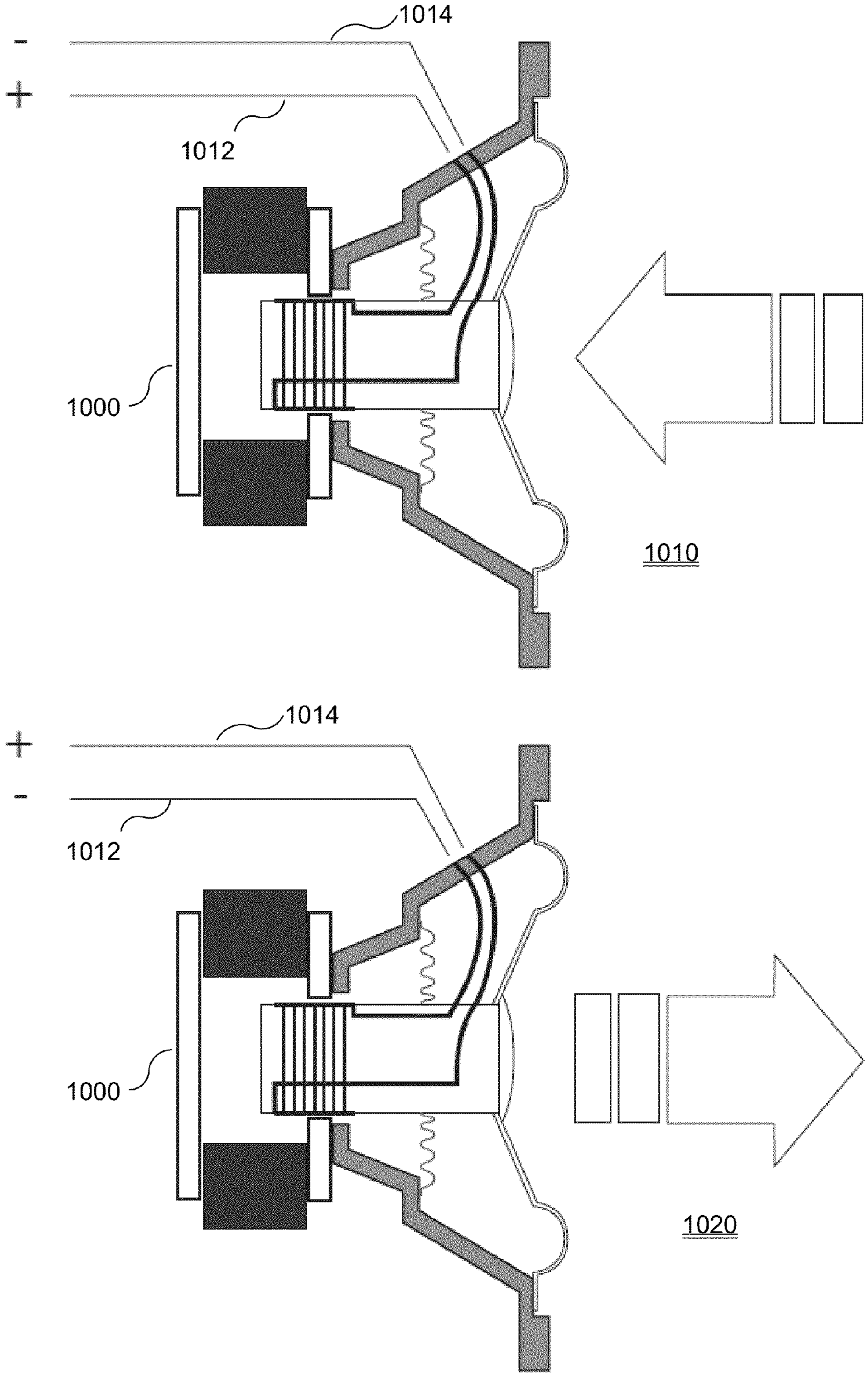
FIG. 10 shows cross sections of a passive radiator connected to a motor to illustrate the function provided by the motor, in accordance with one embodiment.

According to certain examples, each pair of opposed passive radiators 120 uses a loudspeaker drive unit with voice coil and magnet; however, the passive radiators are not connected to the driving amplifier of the system. Instead, each passive radiator of a pair is connected to the other in phase. As shown in FIG. 10, when a passive radiator 1000 moves inwards 1010, a back EMF is generated with positive potential across a first portion of the circuit 1012 and negative potential across a second portion of the circuit 1014. Conversely, when the passive radiator 1000 moves outwards 1020, a back EMF is generated with negative potential across the first portion of the circuit 1012 and positive potential across the second portion of the circuit 1014. As a result, for connected pairs of passive radiators such as those shown in FIGS. 11A and 11B, any in phase behavior (such as standard resonant in-phase movement) is unaffected, but any out of phase movement is damped by the back EMF of each passive radiator, eliminating, or at least substantially reducing, deleterious lateral movement.

Figure 11A:
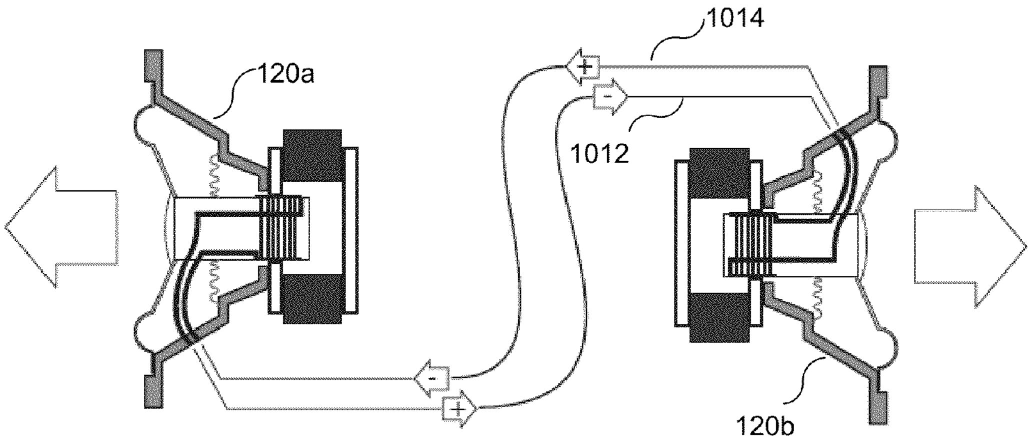
FIGS. 11A and 11B show two passive radiators with electrically connected motors to illustrate how this configuration resists out of phase motion of the pair of passive radiators.
Figure 11B:
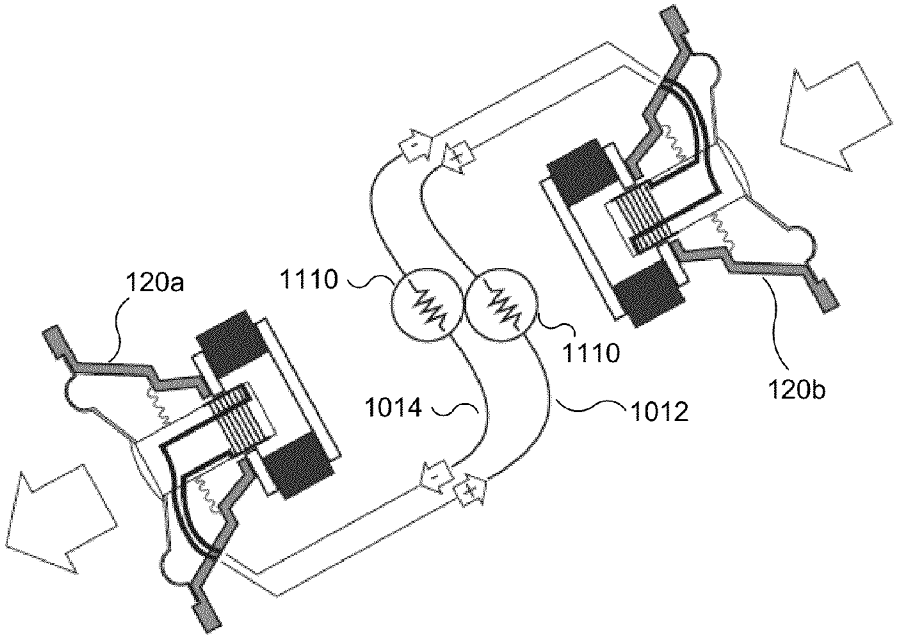

In FIG. 11A, the passive radiators 120*a*, 120*b* are moving in phase. Thus, the back EMF induced in the first and second portions of the circuit 1012, 1014 by each passive radiator 120*a*, 120*b* compliment, and the motion of the passive radiators is unimpeded. Conversely, in FIG. 11B, the passive radiators 120*a*, 120*b* are moving out of phase. Thus, the back EMF induced in the first and second portions of the circuit 1012, 1014 by each passive radiator 120*a*, 120*b* act against each other, resulting in an effective resistance 1110 in the circuit. Thus, the motion of the passive radiators is damped by the generated back EMF. One use of this is to compensate for sag in the passive radiators 120 due to them not being situated on perfectly aligned vertical surfaces. In FIG. 11B, the passive radiators are tilted slightly. As the tuning mass is typically large, this results in a large force on passive radiator 120*a* acting outwards and a large force on passive radiator 120*b* acting inwards. Combined with the high compliance of the passive radiators 120, with potentially results in significant out of phase movement, which can be at least partially compensated for by the back EMF as described above.

In one example, a passive reactive network is connected between the passive radiators of a pair using motors and voice coils, such that back-EMF below a desired frequency is fed out of phase to each passive radiator of the pair. As a result, any movement in a desired band of the frequency range covered by the passive radiators, such as infra-sonic vibrations below the low frequency tuning of the system, or unwanted resonances, may effectively be reduced or eliminated. These passive reactive electrical networks may include, for example, resistors, capacitors, inductors or semiconductors, or state variable designs of the above; and may include parallel, series, or combination circuits of band pass, band reject, high pass or low pass, as may allow the designer to tailor the desired frequency response.

In another example, the loudspeaker system includes a compound or isobaric arrangement of drivers, passive radiators, or both, such that the total system size may be decreased by a factor approaching 2, particularly for the sub-miniaturization of vibrationless passive radiator systems.

In embodiments described above, low frequency loudspeaker systems have balanced passive radiators as shown in FIGS. 1 to 8. In another embodiment, one or more midrange and high frequency active radiators may be mounted on one or more surfaces of the loudspeaker systems to create a balanced full range speaker system.

Having described above several aspects of at least one embodiment, it is to be appreciated various alterations, modifications, and improvements will readily occur to those skilled in the art, and that methods and apparatuses are capable of implementation in other embodiments and of being practiced or of being carried out in various ways. Such alterations, modifications, and improvements are intended to be part of this disclosure and are intended to be within the scope of the invention. It is to be appreciated that embodiments of the methods and apparatuses discussed herein are not limited in application to the details of construction and the arrangement of components set forth in this description or illustrated in the accompanying drawings. Examples of specific implementations are provided herein for illustrative purposes only and are not intended to be limiting. The accompanying figures are included to provide illustration and a further understanding of the various aspects and embodiments, but are not intended as a definition of the limits of the invention. The figures are not intended to be drawn to scale. Also, the phraseology and terminology used herein is for the purpose of description and should not be regarded as limiting. Any references to front and back, left and right, top and bottom, upper and lower, and vertical and horizontal are intended for convenience of description, not to limit the present systems and methods or their components to any one positional or spatial orientation. Accordingly, the foregoing description and drawings are by way of example only.

EXAMPLE

An example loudspeaker system comprises 1 Pair of Seas 6.5" Passive Radiators. Note that 6.5" is what Seas describes the Passive radiators as, however the basket diameter is closer to 6.9" and the effective piston Diameter is approximately 4.4".

Given a modified larger roll Surround (for High Excursion) and modified softer Spider (for High Compliance), each PR has the following characteristics:

| | | |
|---|---|---|
| $S_d$ = | 95 $cm^2$ | Effective Piston Area |
| Nominal $M_{ms}$ = | 41.5 grams | Unmodified Passive Radiator Soft Parts |
| Nominal $F_o$ = | ~27 Hz | |

With 100 g added, for a total Mms of 141.5 grams/Passive Radiator a modified $F_o$ of ~11 Hz can be achieved.

With two PR's as described above, using standard speaker design alignment methods and given a $V_b$ for the enclosure of approximately 600 $in^3$, an equivalent total (single) Passive Radiator $S_d$=190 $cm^2$ (2× the above PR to create a "pair") and a total $M_{ms}$ of 283 g is achieved. The Resultant Box Tuning=~25 to 30 Hz at −3 dB from nominal response.

It is important to note that an equivalent single passive radiator with an Sd of 190 $cm^2$ would have an effective piston diameter of 15.5 cm. Given a standard or even low profile frame and accounting for non-contributing surround area, the total diameter of such a device could easily be 21 cm or approximately 8.25" in diameter.

Given an interior volume of 600 $in^3$ and an approximate 0.75" cabinet thickness, and assuming outside cabinet dimensions of 15.5"×7.5"×7.5" (for a non active design where the size would increase as a result of internal electronics) it's clear that an 8.52" diameter passive radiator actually exceeds two of the three linear speaker size dimensions for a rectilinear enclosure that has proper acoustic proportions (usually an approximation or multiple of 1.618 to 1 or greater across the front face width and height).

It is also clear that given a single moving mass of 283 grams (or 0.623 lbs) that the current embodiment of such a speaker which would be a combination of wood and aluminum having an approximate weight of 18 lbs. could be easily moved by a "greater than ½ lb oscillating mass" moving at 27 Hz.

The invention claimed is:

1. An inertially balanced loudspeaker system comprising:
- a rectilinear enclosure, enclosing a first acoustic volume and a second acoustic volume acoustically separate from the first acoustic volume, the enclosure having opposing first and second vertical sides and a horizontal side comprising either a top side or a bottom side;
- a single active low frequency transducer disposed in the horizontal side and acoustically coupled to the first acoustic volume;
- a high frequency active transducer acoustically coupled to the second acoustic volume; and
- a crossover configured to split an input signal into a low frequency portion and a high frequency portion, the low frequency portion coupled to the low frequency active transducer and the high frequency portion coupled to the high frequency active transducer; and
- a single pair of passive radiators acoustically coupled with the first acoustic volume and consisting of a first passive radiator disposed in the first vertical side and a second passive radiator disposed in the second vertical side, wherein momentum produced by oscillations of the first and second passive radiators is balanced to provide the inertially balanced loudspeaker system.

2. The inertially balanced loudspeaker system of claim 1, further comprising:
- a second rectilinear enclosure, physically coupled to the first rectilinear enclosure and enclosing a third acoustic volume acoustically separated from the first and second acoustic volumes, the second rectilinear enclosure having opposing third and fourth vertical sides and a second horizontal side;
- a second active low frequency transducer disposed in the second horizontal side and acoustically coupled to the third acoustic volume; and
- a single pair of passive radiators acoustically coupled to the third acoustic volume and consisting of a third passive radiator disposed in the third vertical side and a fourth passive radiator disposed in the fourth vertical side, wherein momentum produced by oscillations of the third and fourth passive radiators is balanced to provide the inertially balanced loudspeaker system.

3. The inertially balanced loudspeaker system of claim 2, wherein the horizontal side is a top surface of the rectilinear enclosure and the second horizontal side is a bottom surface of the second rectilinear enclosure.

4. An inertially balanced loudspeaker system comprising:
- a first enclosure enclosing a first acoustic volume, the first enclosure comprising:
  - a first side;
  - a second side, opposite to the first side; and
  - a third side, perpendicular to the first and second sides;
- a single low frequency active transducer disposed on the third side and acoustically coupled to the first acoustic volume;
- a single pair of passive radiators acoustically coupled to the first acoustic volume and consisting of a first passive radiator disposed in the first side and a second passive radiator disposed in the second side, wherein momentum produced by oscillations of the first and second passive radiators is balanced such that the first enclosure is inertially balanced;
- a second enclosure physically coupled to the first enclosure and enclosing a second acoustic volume, the second enclosure comprising:
  - a fourth side;
  - a fifth side, opposite to the fourth side; and
  - a sixth side, perpendicular to the fourth and fifth sides;
- a second low frequency active transducer disposed on the sixth side and acoustically coupled to the second acoustic volume;
- a single pair of passive radiators acoustically coupled to the second acoustic volume and consisting of a third passive radiator disposed in the fourth side and a fourth passive radiator disposed in the fifth side, wherein momentum produced by oscillations of the third and fourth passive radiators is balanced such that the second enclosure is inertially balanced;
- a third enclosure physically coupled to the first and second enclosures and enclosing a third acoustic volume;
- a high frequency active transducer acoustically coupled to the third acoustic volume; and
- a crossover configured to split an input signal into a low frequency portion and a high frequency portion, the low frequency portion coupled to the first and second low frequency active transducers and the high frequency portion coupled to the high frequency active transducer.

5. An inertially balanced loudspeaker system comprising:
- an enclosure having opposing left and right vertical sides, opposing front and back vertical sides, and a horizontal side perpendicular to the vertical sides, the enclosure enclosing a first acoustic volume and a second acoustic volume acoustically separate from the first acoustic volume;
- a single active low frequency active transducer disposed in the horizontal side and acoustically coupled to the first acoustic volume;
- a high frequency active transducer disposed in the front vertical side and acoustically coupled to the second acoustic volume; and
- a crossover configured to receive an input signal and having a low pass filter and a high pass filter, the low pass filter coupled to provide a low frequency portion of the input signal to the low frequency active transducer, and the high pass filter coupled to provide a high frequency portion of the input signal to the high frequency active transducer; and
- a first passive radiator disposed in the left vertical side and acoustically coupled to the first acoustic volume and a second passive radiator disposed in the right vertical side and acoustically coupled to the first acoustic volume, wherein momentum produced by oscillations of the first and second passive radiators is balanced to provide the inertially balanced loudspeaker system.

* * * * *